Figure 1:
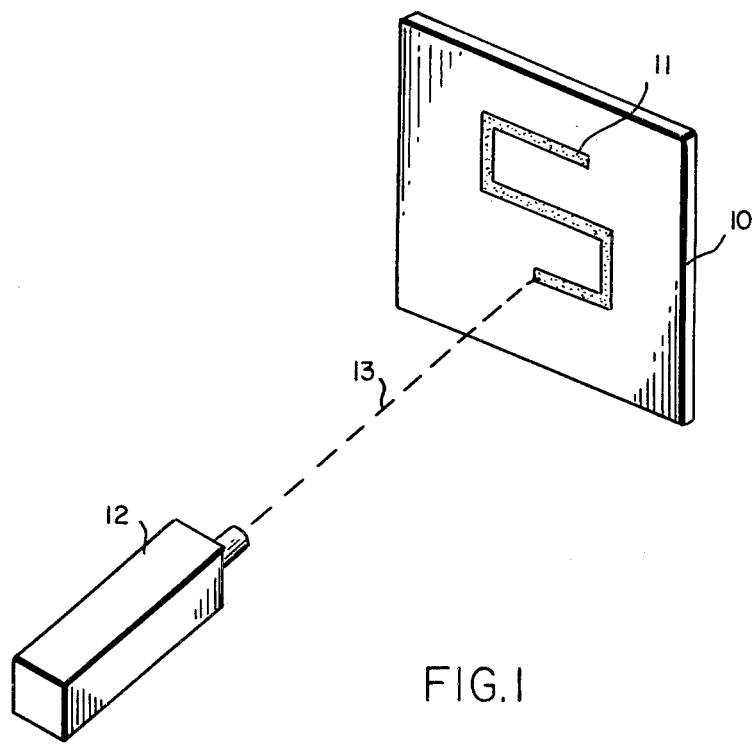

United States Patent [19]

Suh et al.

[11] 4,159,414

[45] Jun. 26, 1979

[54] METHOD FOR FORMING ELECTRICALLY CONDUCTIVE PATHS

[75] Inventors: Nam P. Suh, Sudbury, Mass.; Alonso R. Ramos, Strasbourg, France; Elliot K. Chartash, Brooklyn, N.Y.

[73] Assignee: Massachusetts Institute of Technology, Cambridge, Mass.

[21] Appl. No.: 899,818

[22] Filed: Apr. 25, 1978

[51] Int. Cl.$^2$ .............................................. B23K 9/00
[52] U.S. Cl. .............................. 219/121 LM; 29/624; 29/625; 219/121 EM
[58] Field of Search ..... 219/121 LM, 121 L, 121 EB, 219/121 EW; 29/624, 625

[56] References Cited

U.S. PATENT DOCUMENTS 3,056,881   10/1962   Schwarz ........................ 219/121 EB Primary Examiner—J. V. Truhe
Assistant Examiner—Fred E. Bell
Attorney, Agent, or Firm—Arthur A. Smith, Jr.; Robert F. O'Connell

[57] ABSTRACT

A method for forming electrically conductive paths on a substrate wherein at least a selected surface (or surfaces) of the substrate on which the paths are to be formed is made of a composition which comprises a first material, preferably a polymer material having a metal compound, preferably a metal oxide, incorporated as a filler therein. The selected surface is heated, preferably as by a high intensity laser beam, at the locations where the paths are to be formed to a temperature sufficient to reduce the metal compound to its elemental state whereby the desired electrically conductive paths are formed

13 Claims, 2 Drawing Figures

U.S. Patent  Jun. 26, 1979  4,159,414

METHOD FOR FORMING ELECTRICALLY CONDUCTIVE PATHS

The Government has rights in this invention pursuant NSF Cooperative Agreement CG-0006 awarded by the National Science Foundation.

INTRODUCTION

This invention relates generally to methods and apparatus for providing electrically conductive paths and, more particularly, to methods and apparatus for providing such paths on a substrate, such as a printed circuit board, for example.

BACKGROUND OF THE INVENTION

Substrates, particularly substrates formed of polymer materials, have often been used for printed circuit boards in which an appropriate pattern of conductive paths are formed thereon so that circuit components can be soldered thereto to form an electrical circuit for use in electrical equipment. Methods for forming such conductive paths can be generally classified as additive processes or subtractive processes.

In the additive process approach the polymer substrate is treated in such a way that conductive material, such as metallic copper, is deposited thereon only at those locations where a conductive path is intended to exist in the finished circuit. In the subtractive process approach a conductive material, such as copper, is initially deposited over the entire substrate surface area and is then subsequently removed, as by suitable etching processes, for example, from the areas that are to remain non-conductive. In each approach the overall conductive pattern which represents the circuit pattern is effectively produced substantially at the same time. Such techniques, moreover, are normally suitable only for the production of circuits on two dimensional, i.e., flat, surfaces.

It is desirable to find a method and apparatus by which conductive paths can be formed in a simpler manner, and which method and apparatus can be readily adapted for the formation thereof on three-dimensional surfaces. Such method need not provide for the simultaneous formation of the entire conductive pattern.

BRIEF SUMMARY OF THE INVENTION

In accordance with the invention, a conductive path is formed by providing a polymer substrate which has a metal compound initially incorporated into the polymer matrix thereof as a filler material. The conductive path is obtained by selectively heating the substrate at the locations which form the desired conductive pattern. The selective application of heat to the substrate causes the metal compound therein to be reduced to its elemental metallic state, the overall reaction including the formation of gaseous compounds, thereby leaving the metallic element at the selectively heated locations.

Figure 2:
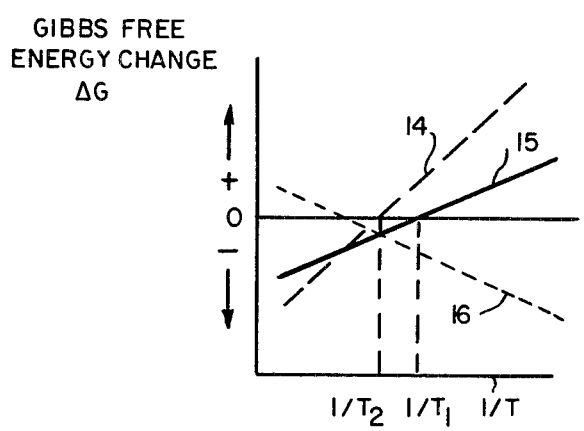

The invention can be described in more detail with the help of the accompanying drawings wherein:

FIG. 1 depicts a diagrammatic perspective view of an embodiment of the invention; and FIG. 2 depicts a graph of Gibbs Free Energy levels ($\Delta G$) as a function of inverse temperature for various conditions in the use of the invention.

As can be seen in FIG. 1, a substrate 10 which is intended, for example, to be utilized as a printed circuit substrate on which a circuit pattern of conductive paths is to be formed is an organic material having a metal compound filler therein. Although not limited thereto, typical organic materials which may be employed are polyethylene, cellulose acetate, paraffin wax, or an epoxy resin. In many applications it appears that an epoxy resin material is probably preferable because of the higher cross-linking densities in the resin. The metal compounds may be any of the types which decompose upon heating to an elemental metal state, such compounds generally being selected to have a high content of metal in the compound itself and a relatively low decomposition temperature. Metal oxides appear to be among the most preferable compounds. Typical metal compounds which may be utilized are $Cu_2O$, $CuO$, $TbO$, $NiO$, $CuCl_2$, or $SnO$, for example. The substrate material should be relatively highly loaded with the metal compound, typical loading values being in a range from about 60% by volume to about 90% by volume, an effective loading being about 75% by volume. The volume fraction of metal compounds can be increased by compacting a slurry consisting of the compound and the matrix in such a way that the liquid matrix phase is further reduced by squeezing out of the slurry.

The surface of the substrate is then subjected to heat at the locations which form a desired conductive path 11 thereon. One technique by which such high temperature heat can be applied is by the use of a laser beam which is movably mounted so as to trace the desired conductive path in such a way that the laser beam impinges on the substrate and raises the temperature of the substrate surface sufficiently high to cause the metal compound filler therein to decompose so that it is reduced to its elemental metal state. For a metal oxide, for example, such reduction is exemplified by the reaction

While the reduction exemplified by the above discussed reaction can often be achieved at reasonable temperatures, in some cases the temperature may be relatively higher than is desired (e.g. reduction of CuO is achieved at about 1150° C.). Thus, it may be desirable in some applications to lower the decomposition temperature. This lowering can be achieved in accordance with the invention by coupling the metal reduction reaction with the oxidation of a carbon compound (e.g. an epoxy or a hydrocarbon containing polymer) which produces metal and carbon oxides and other products. Such overall reaction can be exemplified as follows:

The reduction of the decomposition temperature is illustrated graphically in FIG. 2 which depicts the change in Gibbs Free Energy, $\Delta G$, as a function of inverse temperature T. In such reactions reduction occurs when the Gibbs Free Energy change, $\Delta G$, is negative. As can be seen therein, for the metal compound reduction reaction above (curve 14) the reduction temperature occurs at $T_2$ ($\Delta G$ is negative at $1/T_2$). In an overall reaction (curve 15) which includes both the metal compound reduction and polymer oxidation reaction (curve 16), $\Delta G$ becomes negative at $1/T_1$, $T_1$ being lower than $T_2$.

The process in accordance with the invention has been successfully performed utilizing a 50 watt laser having a beam diameter of 3 millimeters, such a laser, for example, as supplied by Apollo Lasers Inc. under the designation Model 500. The laser and substrate are appropriately moved relative to each other so that the laser beam can effectively trace out the desired conductive path. Such relative motion can be obtained by utilizing a fixed laser beam and moving substrate 10 with reference thereto, or by holding the substrate fixed and moving the laser beam. Methods for performing the relative motion in accordance with either technique would be well known to those in the art and the motions can be effectively controlled by data processing techniques which would be well known to the art and which need not be described in more detail herein.

Since the maximum temperature which can be achieved at the surface of the polymeric substrate which is being heated by the laser beam is a direct function of the laser power and is an inverse function of the laser beam diameter and the velocity of the beam relative to the surface as it moves thereover, the speed at which the pattern can be formed may be increased by making the width of the desired conductive path (i.e., the laser beam diameter) as small as possible.

It appears that relatively highly conductive paths can be obtained by utilizing $Cu_2O$ in which there is a relatively low content of non-metal atoms and a high conductivity metal. With a relatively low content of non-metal atoms, shrinkage which normally occurs during the decomposition process is decreased. The $Cu_2O$ can be incorporated into the polymer matrix as a filler by utilizing well-known mixing techniques, the loading level being as high as possible without degrading the mechanical properties of the overall composition.

Because the relative motions of the substrate and the laser beam can be readily controlled, the technique of the invention can be readily adapted for producing conductive paths on three-dimensional objects so that the technique is not limited to the formation thereof on flat surfaces. While laser beams have been utilized successfully in forming such circuit patterns, other techniques for raising the temperature of the substrate surface can be utilized. For example, electron beam impingement from a suitable electron beam source or direct contact of the polymer substrate surface with a solid heated to the necessary temperature also may be used. While the technique has been described with reference to a polymer substrate having the metal compound filler incorporated therein, the substrate need not be so formed but may be of any suitable material which has a surface coating of a polymer composition, for example, having the metal compound incorporated therein. The thickness of the coating must be sufficient to assure that the conductive path which is formed has adequate current carrying capacity. The unheated portions of the original surface coating may be retained or may be removed by appropriate chemical or other means. Moreover, more than one metal compound may be incorporated into the composition which is to be heated.

Hence, the invention is not to be limited to the specific embodiment discussed herein except as defined by the appended claims.

What is claimed is:

1. A method for forming electrically conductive regions at selected locations on at least one surface of a substrate comprising the steps of forming at least selected portions, which contain said selected locations, of said at least one surface of said substrate of a composition comprising a matrix of a first reducing material having a metal compound incorporated as a filler therein;

heating said selected locations to a temperature sufficient to reduce said metal compound to its elemental metal state whereby electrically conductive regions are formed at said selected locations on said at least one surface.

2. A method for forming one or more electrically conductive paths on at least one surface of a substrate comprising the steps of forming said at least one surface of said substrate of a composition comprising a matrix of a polymer reducing material having a metal compound incorporated as a filler therein;

heating said at least one surface of said substrate at selected locations where it is desired to form said one or more electrically conductive paths to a temperature sufficient to reduce said metal compound to its elemental metal state at said selected locations.

3. A method in accordance with claim 2 wherein the entire substrate is formed of said composition.

4. A method in accordance with claim 2 wherein said substrate is formed of a first material and said at least one surface thereof is coated with said composition.

5. A method in accordance with claim 3 wherein said heting step is performed by applying a laser beam to said selected locations.

6. A method in accordance with claim 5 wherein said laser beam has a beam diameter of about 3 millimeters.

7. A method in accordance with claim 3 wherein said heating step is performed by applying an electron beam to said selected locations.

8. A method in accordance with claim 2 wherein the polymer material of said composition is selected from the group consisting of polyethylenes and epoxy resins.

9. A method in accordance with claim 8 wherein the metal compound of said composition is a metal oxide.

10. A method in accordance with claim 1 wherein said metal compound is selected from the group consisting of $Cu_2O$, $CuO$, $NiO$, $CuCl_2$ and $SnO$.

11. A method in accordance with claim 10 wherein said composition comprises an epoxy resin matrix having $Cu_2O$ incorporated therein.

12. A method in accordance with claim 2 wherein said composition incorporates said metal compound in a range from about 60% by volume to about 95% by volume.

13. A method in accordance with claim 1 wherein said composition incorporates about 75% by volume of said metal compound.

* * * * *